US006992557B2

(12) United States Patent
Aoyagi

(10) Patent No.: US 6,992,557 B2
(45) Date of Patent: Jan. 31, 2006

(54) PRINTED INDUCTOR CAPABLE OF RAISING Q VALUE

(75) Inventor: Toru Aoyagi, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 99 days.

(21) Appl. No.: 10/737,633

(22) Filed: Dec. 15, 2003

(65) Prior Publication Data

US 2004/0124961 A1 Jul. 1, 2004

(30) Foreign Application Priority Data

Dec. 16, 2002 (JP) ............................ 2002-363905

(51) Int. Cl.
*H01F 5/00* (2006.01)

(52) U.S. Cl. ....................... 336/200; 336/232; 336/223

(58) Field of Classification Search ................ 336/200, 336/223, 232, 83; 29/602.1
See application file for complete search history.

(56) References Cited

U.S. PATENT DOCUMENTS 3,988,764 A * 10/1976 Cline et al. ................. 257/531
4,729,510 A * 3/1988 Landis ....................... 333/162
6,054,750 A * 4/2000 Imam et al. ................ 257/531
6,249,039 B1 * 6/2001 Harvey et al. .............. 257/531
6,531,945 B1 * 3/2003 Ahn et al. .................. 336/200
2002/0105406 A1 * 8/2002 Liu et al. .................... 336/200

FOREIGN PATENT DOCUMENTS

JP 07-272932 10/1995

* cited by examiner

*Primary Examiner*—Anh Mai
(74) *Attorney, Agent, or Firm*—Brinks Hofer Gilson & Lione

(57) ABSTRACT

There is disclosed a printed inductor 1 having a spiral coil formed outside a cavity 2 by providing an insulating substrate 3 with the cavity 2 extending in a direction orthogonal to that of the thickness of the insulating substrate 3, forming a plurality of mutually independent printed wiring lines 4 on both the top and bottom faces of the insulating substrate 3 facing each other through the cavity 2, and sequentially and continuously connecting terminals of the printed wiring lines 4 on both the top and bottom faces to each other through a plurality of through holes 5.

4 Claims, 3 Drawing Sheets

PRINTED INDUCTOR CAPABLE OF RAISING Q VALUE

This application claims the benefit of priority to Japanese Patent Application No. 2002-363905 herein incorporated by reference.

BACKGROUND OF THE INVENTION

1. Field of the Invention

The present invention relates to a printed inductor that is three-dimensionally formed on an insulating substrate via through holes.

2. Description of the Related Art

In generally known printed inductors, conductor patterns are formed on the same plane of an insulating substrate in a spiral shape or a meandering (serpentine) shape. However, there are disadvantages with such patterns in that the ratio of the conductor patterns occupying the insulating substrate increases, and it is difficult to effectively form these inductors on the limited region of the insulating substrate. Therefore, technologies have been conventionally proposed wherein a three-dimensional printed inductor is formed on the insulating substrate via through holes and the limited region of the insulating substrate is effectively used. An example thereof is disclosed in Patent document 1.

FIG. 7 is a perspective view of a printed inductor according to a conventional example disclosed in the Patent document 1. As shown in FIG. 7, a plurality of mutually independent printed wiring lines 1 is formed on the top and bottom faces of an insulating substrate 10. Further, both ends of respective printed wiring lines 1, which are formed on the top face, forms connecting terminal portions 11*a*. These printed wiring lines 1 are disposed parallel to each other in a slant direction, respectively. Further, ends of the respective printed wiring lines 1 on both the top and bottom faces are sequentially and continuously connected to each other through a plurality of through holes 12. As a result, the printed inductor 13 is formed in a spiral coil as the insulating substrate 10 is regarded as the center of axis.

[Patent Document 1]

Japanese Unexamined Patent Application Publication No. 7-272932 (Page 3, FIG. 3)

According to the aforementioned conventional art shown in FIG. 7, it is possible to form the printed inductor having a relatively large inductance value (L value) on a limited occupied area of the insulating substrate. However, since the printed wiring lines and the through holes are formed in a spiral shape as the insulating substrate is regarded as the center of axis, the printed wiring lines on both the top and bottom faces of the insulating substrate may be easily bonded dielectrically to each other through the insulating material which exists in the center of axis of the insulating substrate. As a result, when a resonance circuit such as a low-pass filter is composed of the printed inductor and the capacitor, it is difficult to raise Q value of the resonance circuit.

Further, in the aforementioned conventional art, in case of raising the inductance of the printed inductor, technologies have been adopted wherein a magnetic substance film is coated on the surface of the insulating substrate so as to cover the printed wiring lines, or the magnetic substance film is formed in the insulating substrate in a sandwich shape. However, it is not possible to sufficiently secure the thickness of the magnetic substance film although any of the aforementioned technologies is used. As a result, it is difficult to obtain a large inductance value.

SUMMARY OF THE INVENTION

The present invention has been achieved in view of the situations of the conventional art as described above. It is therefore an object of the present invention to provide a printed inductor capable of raising Q value.

In order to achieve the above object, in the printed inductor according to the present invention, a spiral coil is formed outside a cavity by providing an insulating substrate with the cavity extending in a direction orthogonal to that of the thickness of the insulating substrate, forming a plurality of mutually independent printed wiring lines on both the top and bottom faces of the insulating substrate facing each other through the cavity, and sequentially and continuously connecting terminals of the printed wiring lines on both the top and bottom faces to each other through a plurality of through holes.

According to the printed inductor having the above configuration, the spiral coil comprises a plurality of mutually independent printed wiring lines and a plurality of through holes. The spiral coil is formed outside a cavity provided in the insulating substrate. As a result, it is possible to reduce the degree of dielectric bonding among the printed wiring lines formed on both the top and bottom faces of the insulating substrate, thereby raising Q value.

In the above configuration, if the cavity is filled with a magnetic material such as ferrite, it is possible to raise an inductance value, and it is also possible to control the inductance value by selecting magnetic materials or changing the filling amount of a magnetic material.

In addition, in the above configuration, although the magnetic material is attached to the inner wall surface of the cavity, it is possible to raise the inductance value. In this case, a low temperature co-fired ceramic (LTCC) substrate is preferably used as the insulating substrate.

DESCRIPTION OF THE PREFERRED EMBODIMENTS

Figure 1:
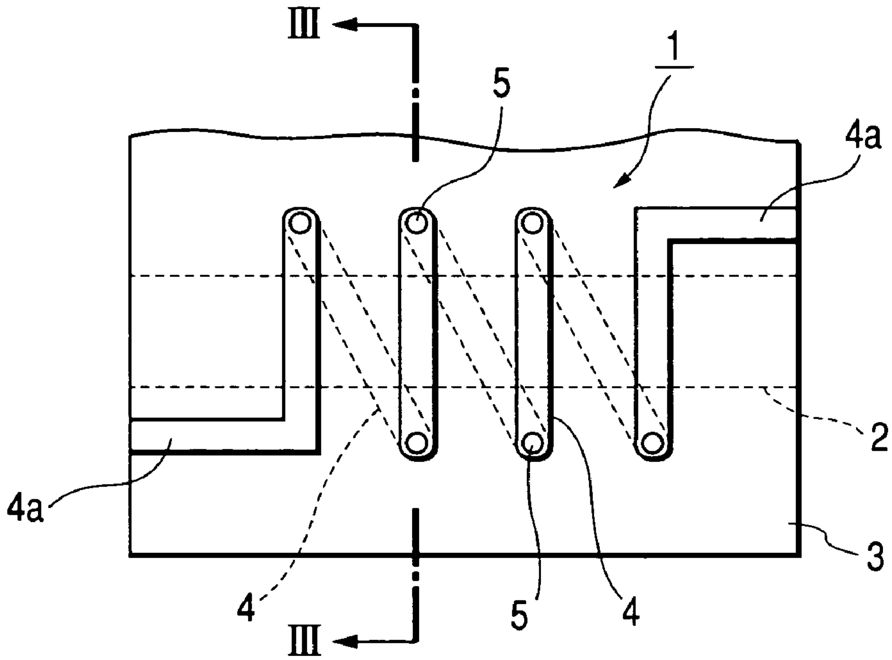
FIG. 1 is a plan view of a printed inductor according to a first embodiment of the present invention.
Figure 2:
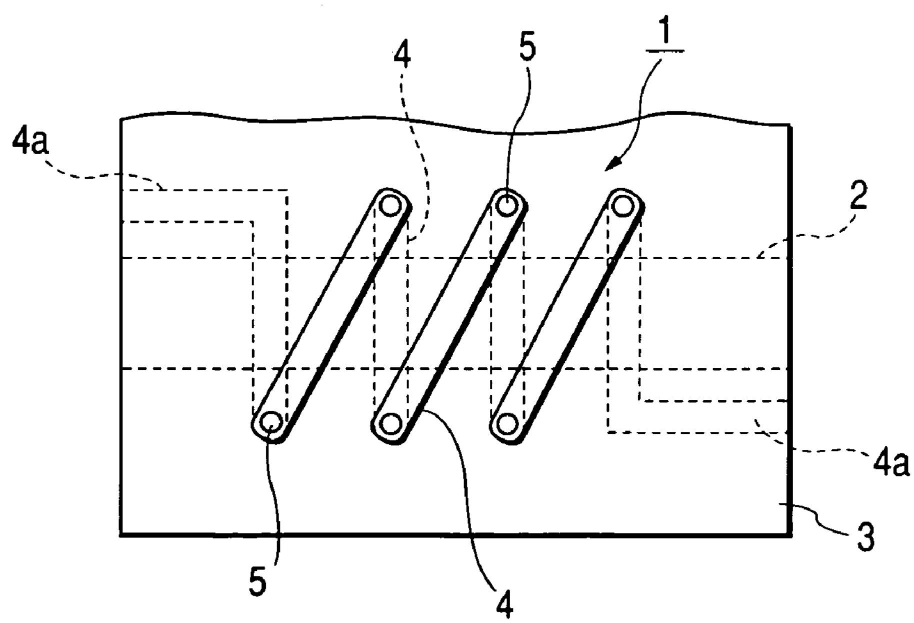
FIG. 2 is a back view of the printed inductor according to the first embodiment of the present invention.
Figure 3:
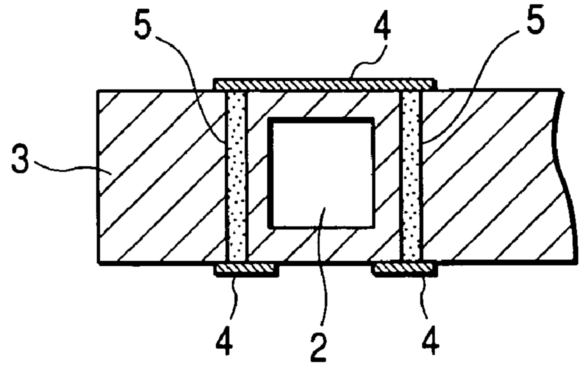
FIG. 3 is a cross-sectional view taken along the line III—III of FIG. 1.
Figure 4:
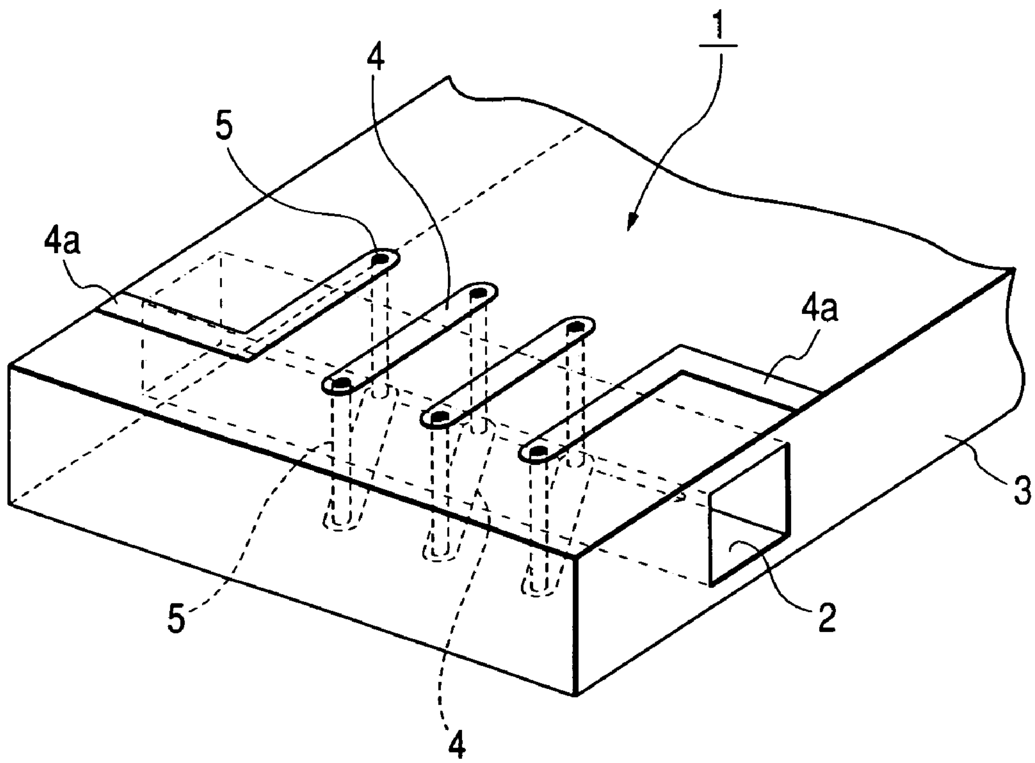
FIG. 4 is a perspective view of the printed inductor according to the first embodiment of the present invention.

Hereinafter, preferred embodiments of the present invention will be described in detail with reference to the accompanying drawings. FIG. 1 is a plan view of a printed inductor according to a first embodiment of the present invention. FIG. 2 is a back view of the printed inductor according to the first embodiment of the present invention. FIG. 3 is a cross-sectional view taken along the line III—III of FIG. 1. FIG. 4 is a perspective view of the printed inductor according to the first embodiment of the present invention.

As shown in those drawings, the printed inductor 1 according to the first embodiment comprises an insulating substrate 3 having a cavity 2, a plurality of mutually independent printed wiring lines 4 formed on both the top and bottom faces of the insulating substrate 3, respectively, a plurality of through holes 5 for sequentially and continuously connecting terminals of the printed wiring lines 4 on the top and bottom faces to each other. The printed wiring lines 4 and the through hole 5 are formed in a spiral coil as the cavity 2 is regarded as the center of axis.

The insulating substrate 3 is made of, for example, a low temperature co-fired ceramic substrate, which is formed by mixing a crystallized glass with ceramic, and baking a green sheet obtained after kneading these materials at around 900° C. The cavity 2 extends in the insulating substrate 3 in a direction orthogonal to that of the thickness thereof. As apparent from FIG. 3, the cross-sectional shape of the cavity is a rectangular shape. The cavity 2 can be formed in the insulating substrate 3 after baking by machining. However, in the first embodiment, the cavity may be formed in a green sheet before baking using the benefit of the low temperature co-fired ceramic substrate having small heat shrinkage.

Figure 7:
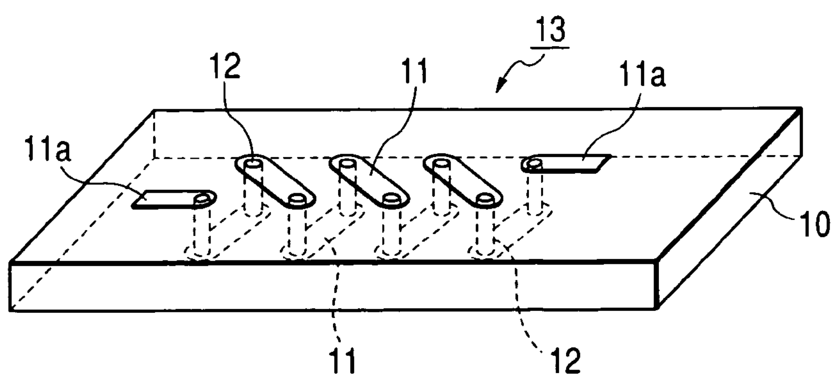
FIG. 7 is a perspective view of a printed inductor according to a conventional example.

Each printed wiring line 4 is obtained by forming a conductor film such as Cr and Cu on both the top and bottom faces of the insulating substrate 3 using a known film forming means. Both ends of the printed wiring lines 4, which are formed on the top face, form connecting terminal portions 4*a*. In the first embodiment, among printed wiring lines 4 on both the top and bottom faces of the insulating substrate facing each other through the cavity 2, the printed wiring lines 4 on the top face are disposed parallel to each other in straight line direction, and also the printed wiring lines 4 on the bottom face are disposed parallel to each other in a slant direction. However, similar to the aforementioned conventional example (see FIG. 7), the printed wiring lines 4 on both the top and bottom faces of the insulating substrate may be changed in their directions and may be disposed parallel to each other in slant directions.

Each through hole 5 extends outside the cavity 2 so that it passes through the insulating substrate 3 in a direction of thickness thereof. Further, ends of the printed wiring lines 4 on both the top and bottom faces of the insulating substrate are sequentially and continuously connected to each other through the through holes 5. The through holes 5 are one wherein via holes formed in the insulating substrate 3 are filled with conductive material such as Ag or Ag/Pd, or one wherein the conductive material is formed on an inner wall surface of the via holes using plating. In the first embodiment, the through holes 5 are formed by filling a plurality of via holes perforated in the green sheet with Ag paste, and baking Ag paste and the green sheet simultaneously. In this manner the low temperature co-fired ceramic substrate has an advantage that, at the time of baking the green sheet, it is possible to form the cavity 2 and the through hole 5 simultaneously.

The printed inductor 1 having a configuration as described above is connected to, for example, a capacitor (not shown), which is formed on the insulating substrate 3, through the terminal portions 4*a* so as to construct a resonance circuit such as a low-pass filter. In this case, a spiral coil is formed outside the cavity 2 by the printed wiring lines 4 on both the top and bottom faces of the insulating substrate 3 and the plurality of through holes 5. That is, since the spiral coil is formed as the cavity 2 in which air space (dielectric constant $\epsilon \approx 1$) is formed is regarded as the center of axis, the degree of dielectric bonding among the printed wiring lines 4 on both the top and bottom faces of the insulating substrate facing each other through the cavity 2 can be reduced, thereby raising Q value of a resonance circuit.

Figure 5:
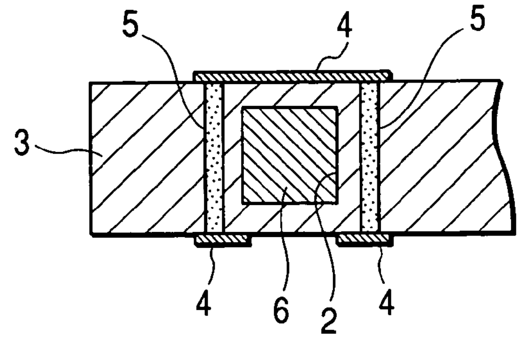
FIG. 5 is a cross-sectional view of a printed inductor according to a second embodiment of the present invention.

FIG. 5 is a cross-sectional view of a printed inductor according to a second embodiment of the present invention. In FIG. 5, similar reference numerals are given to elements corresponding to FIG. 1 to FIG. 4.

Except that the cavity 2 is filled with a magnetic material 6, the second embodiment is basically identical to the first embodiment in configuration. The magnetic material 6 is made of ferrite having a high magnetic permeability. The magnetic material 6 may be inserted into the cavity 2 from the end face thereof after baking the insulating substrate 3. Otherwise, the magnetic material 6 may be buried in the cavity 2 after being buried in the green sheet.

According to the printed inductor of the second embodiment constructed as described above, the magnetic material 6 can fill the cavity 2 using a broad space therein. As a result, the second embodiment has the same effect as that of the first embodiment. In addition, it is possible to raise an inductance value largely. Further, by selecting the magnetic material 6 having a different magnetic permeability or changing the filling amount of the magnetic material 6 into the inner space of the cavity 2, it is also possible to adjust the inductance value.

Figure 6:
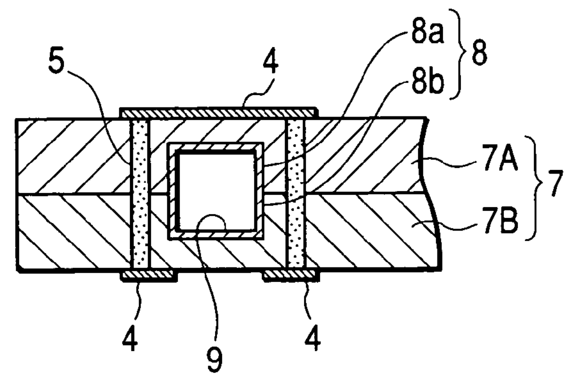
FIG. 6 is a cross-sectional view of a printed inductor according to a third embodiment of the present invention.

FIG. 6 is a cross-sectional view of a printed inductor according to a third embodiment of the present invention. Similar reference numerals are given to elements corresponding to FIG. 1 to FIG. 4.

Except that the low temperature co-fired ceramic substrate 7 is used as the insulating substrate, and a magnetic material 9 made of ferrite, etc., is attached to the inner wall surface of the cavity 8, which is provided in the low temperature co-fired ceramic substrate (LTCC) 7, the third embodiment is basically identical to the first embodiment in configuration. The low temperature co-fired ceramic substrate 7 is obtained by superposing at least two or more low temperature co-fired ceramics 7A, 7B as much as the necessary number of sheets. Concave portions 8*a*, 8*b* of these low temperature co-fired ceramics 7A, 7B is caused to face each other, thereby forming the cavity 8 having a section of a rectangular shape. The magnetic material 9 is formed by baking magnetic paste, which is mixed with magnetic powder such as ferrite. In the third embodiment, the inner wall surface of the concave portions 8*a*, 8*b*, which are formed in two green sheets, are coated with the magnetic paste, and the magnetic paste and the green sheets are simultaneously fired so that the magnetic material 9 is attached to the inner wall surface of the cavity 8.

According to the printed inductor of the third embodiment constructed as described above, the magnetic material 9 can be attached to a broad inner wall surface of the cavity 8. As a result, the third embodiment has the effect similar to that of the first embodiment. In addition, it is possible to raise an inductance value largely. Further, the low temperature co-fired ceramic substrate 7 is used as the insulating substrate. Thus, when the green sheets are fired, it is possible to simultaneously form the cavity 8 and the magnetic material 9 therein. Further, since the cavity 8 is formed by the concave portions 8*a*, 8*b* of the two green sheets, it is possible to implement the low temperature co-fired ceramic substrate 7 in which opening edges of the cavity 8 are not exposed.

The present invention is embodied as mentioned above, and has effects as follows.

A spiral coil is formed outside the cavity by a plurality of mutually independent printed wiring lines and a plurality of through holes. As a result, the degree of dielectric bonding among the printed wiring lines formed on both the top and bottom faces of the insulating substrate through the cavity can be reduced, thereby raising Q value. Further, the inductance value can be largely raised by filling the cavity with the magnetic material or attaching the magnetic material to the inner wall surface of the cavity.

What is claimed is:

1. A printed inductor having a spiral coil formed by forming a plurality of mutually independent printed wiring lines on both top and bottom faces of an insulating substrate and sequentially and continuously connecting terminals of the printed wiring lines on both the top and bottom faces to each other through a plurality of through holes, wherein a cavity is formed between the top and bottom faces of the insulating substrate so as to extend in a direction orthogonal to the through holes and extend along the center axis of the spiral coil.

2. The printed inductor according to claim 1, wherein the cavity is filled with a magnetic material.

3. The printed inductor according to claim 1, wherein a magnetic material is attached to an inner wall surface of the cavity.

4. The printed inductor according to claim 1, wherein the insulating substrate is formed by laminating a substrate having a concave portion on the bottom face thereof with a substrate having a concave portion on the top face thereof.

* * * * *

UNITED STATES PATENT AND TRADEMARK OFFICE

CERTIFICATE OF CORRECTION

PATENT NO. : 6,992,557 B2
APPLICATION NO. : 10/737633
DATED : January 31, 2006
INVENTOR(S) : Toru Aoyagi It is certified that error appears in the above-identified patent and that said Letters Patent is hereby corrected as shown below:

On the Title Page

In column 2, item (57), delete lines 1-10 under "ABSTRACT", and insert --A printed inductor 1 has a spiral coil formed outside a cavity 2 by providing an insulating substrate 3 with the cavity 2 extending in a direction orthogonal to that of the thickness of the insulating substrate 3. A plurality of mutually independent printed wiring lines 4 are formed on both the top and bottom faces of the insulating substrate 3 facing each other through the cavity 2. Terminals of the printed wiring lines 4 are sequentially and continuously connected on both the top and bottom faces to each other through a plurality of through holes 5.--.

Signed and Sealed this

First Day of August, 2006

JON W. DUDAS
*Director of the United States Patent and Trademark Office*